United States Patent
Tseng

(10) Patent No.: US 8,256,730 B2
(45) Date of Patent: Sep. 4, 2012

(54) FIXING MEMBER FOR HANDHELD ELECTRONIC

(75) Inventor: Tien-Chung Tseng, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 98 days.

(21) Appl. No.: 12/176,473

(22) Filed: Jul. 21, 2008

(65) Prior Publication Data

US 2009/0272867 A1 Nov. 5, 2009

(30) Foreign Application Priority Data

May 2, 2008 (TW) .............................. 97207687 U

(51) Int. Cl.
*A47F 5/00* (2006.01)

(52) U.S. Cl. ............. 248/309.1; 248/346.01; 248/346.5; 248/176.1

(58) Field of Classification Search ............. 248/346.01, 248/346.03, 349.1, 346.5, 309.1, 176.1, 314, 248/453, 316.2; 361/679.41, 679.43, 679.58
See application file for complete search history.

(56) References Cited

U.S. PATENT DOCUMENTS

| | | | | |
|---|---|---|---|---|
| 867,199 A * | 9/1907 | Jack | .............................. | 248/113 |
| 1,485,092 A * | 2/1924 | Rauchut | .......................... | 24/526 |
| 2,370,876 A * | 3/1945 | Richardson | ..................... | 211/68 |
| 3,013,756 A * | 12/1961 | Boston | .......................... | 248/113 |
| 4,134,499 A * | 1/1979 | Joswig | ............................. | 211/66 |
| 4,798,298 A * | 1/1989 | Ursetta | ........................ | 211/70.5 |
| 5,342,010 A * | 8/1994 | Huang | ......................... | 248/316.3 |
| 5,607,125 A * | 3/1997 | Spencer | ........................... | 248/51 |
| 5,619,397 A * | 4/1997 | Honda et al. | ............. | 361/679.43 |
| 5,627,727 A * | 5/1997 | Aguilera et al. | ......... | 361/679.43 |
| D424,263 S * | 5/2000 | Canni Ferrari et al. | ........ | D32/51 |
| 6,185,094 B1 * | 2/2001 | Ruch et al. | ............... | 361/679.44 |
| 6,438,229 B1 * | 8/2002 | Overy et al. | .................. | 379/446 |
| 6,848,662 B2 * | 2/2005 | Paramonoff et al. | ...... | 248/309.1 |
| 6,959,899 B2 * | 11/2005 | Yeh | .......................... | 248/346.03 |
| 7,407,143 B1 * | 8/2008 | Chen | .......................... | 248/309.1 |
| 7,445,129 B2 * | 11/2008 | Lin | .............................. | 211/70.6 |
| 7,453,693 B2 * | 11/2008 | Tomino et al. | ........... | 361/679.48 |
| 2003/0111583 A1 * | 6/2003 | Gaetano | .......................... | 248/473 |
| 2007/0074358 A1 * | 4/2007 | Tsai | .................................. | 15/42 |
| 2007/0272821 A1 * | 11/2007 | Chung | ........................... | 248/676 |

* cited by examiner

*Primary Examiner* — Terrell McKinnon
*Assistant Examiner* — Michael McDuffie
(74) *Attorney, Agent, or Firm* — Ming Chow; Sinorica, LLC

(57) ABSTRACT

A fixing member for handheld electronics is disclosed. The fixing member includes a fixing seat, a slot disposed in the fixing seat, a rotation axis set on the fixing seat, a one-way rolling member pivoted in the fixing seat and part of the one-way rolling member exposes on inner surface of the slot. The one-way rolling member is set on the rotation axis. Thus a side wall of the handheld electronic leans against the one-way rolling member when a handheld electronic is set inside the slot. Therefore, the handheld electronic is mounted inside the slot easily and stably without falling off.

3 Claims, 6 Drawing Sheets

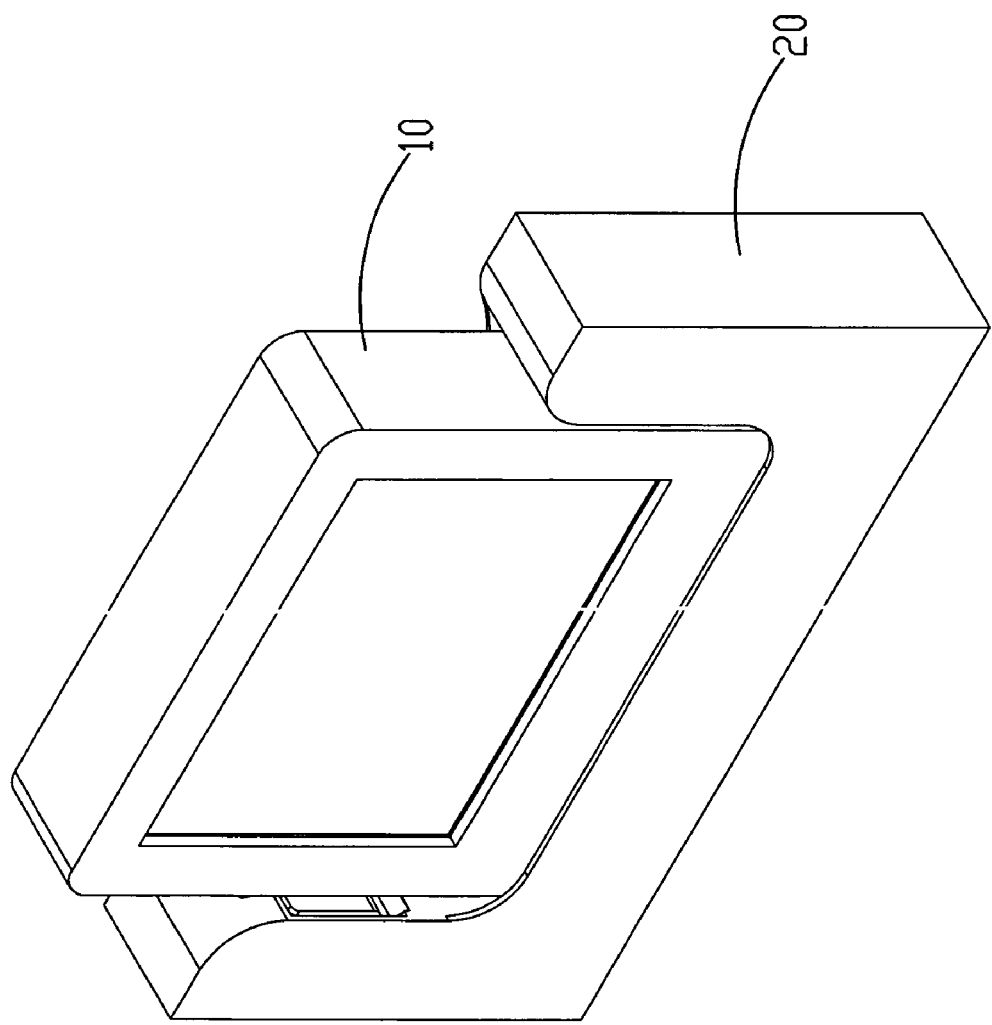

FIXING MEMBER FOR HANDHELD ELECTRONIC

BACKGROUND OF THE INVENTION

The present invention relates to a fixing member, especially to a fixing member for handheld electronics.

There are various types of handheld electronics such as PDA (Personal Digital Assistant), GPS (Global Position System) and mobile phones etc. For convenience of using handheld electronics in vehicles, a fixing member for handheld electronics is set inside the vehicles. There are various designs of fixing member for handheld electronics available on the market now. Most common one is hook-and-lock type or clip type. However, both have its disadvantages.

The hook-and-lock type fixing member requires precise location. After being used for a period of time, the device may have wear and tear. Thus the hook and the lock may slip from each other. Therefore, the handheld electronic is unable to be fixed by the hook-and-lock. As to the clip-type, a gear set is used for clipping. Such design is not only complicated but also easy to get damages. The device is inconvenient for use.

Thus there is a need to develop a fixing member for handheld electronics with features of simple structure, holding the handheld electronic tightly and convenience of use for overcoming above shortages.

SUMMARY OF THE INVENTION

Therefore it is a primary object of the present invention to provide a fixing member for handheld electronics that includes a slot disposed in a fixing seat and at least one one-way rolling member pivoted inside the fixing seat while part of the one-way rolling member exposes on inner surface of the slot. When the handheld electronic is mounted in the slot, a side wall of the handheld electronic leans against the one-way rolling member so that the handheld electronic is set in the slot firmly without falling off.

It is another object of the present invention to provide a fixing member for handheld electronics that includes an elastic arm disposed on the side wall of the slot and the one-way rolling member is disposed on the elastic arm. Thus by the elastic arm, the one-way rolling member has elasticity for clipping so that the handheld electronic is mounted in the slot more firmly.

In order to achieve objects, the fixing member for handheld electronics according to the present invention consists of a fixing seat, a rotation axis and at least one-way rolling member. The fixing seat is disposed with a slot and the rotation axis is set on the fixing seat. The one-way rolling member is pivoted in the fixing seat by the rotation axis and part of the one-way rolling member exposes on inner surface of the slot. Thus the side wall of the handheld electronic leans against the one-way rolling member when the handheld electronic is set in the slot. Therefore, the handheld electronic is set in the slot more easily and firmly without falling off from the slot.

Moreover, the present invention further includes an elastic arm that is set on a side wall of the slot. The rotation axis is disposed on the elastic arm. Thus the side wall of the handheld electronic leans against the one-way rolling member when the handheld electronic is set in the slot. Therefore, the handheld electronic is set in the slot more easily and firmly without falling off from the slot.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein FIG. 1A is a perspective view showing a handheld electronic assembled with an embodiment of a fixing member according to the present invention;

DETAILED DESCRIPTION OF THE PREFERRED EMBODIMENT

Figure 1B:
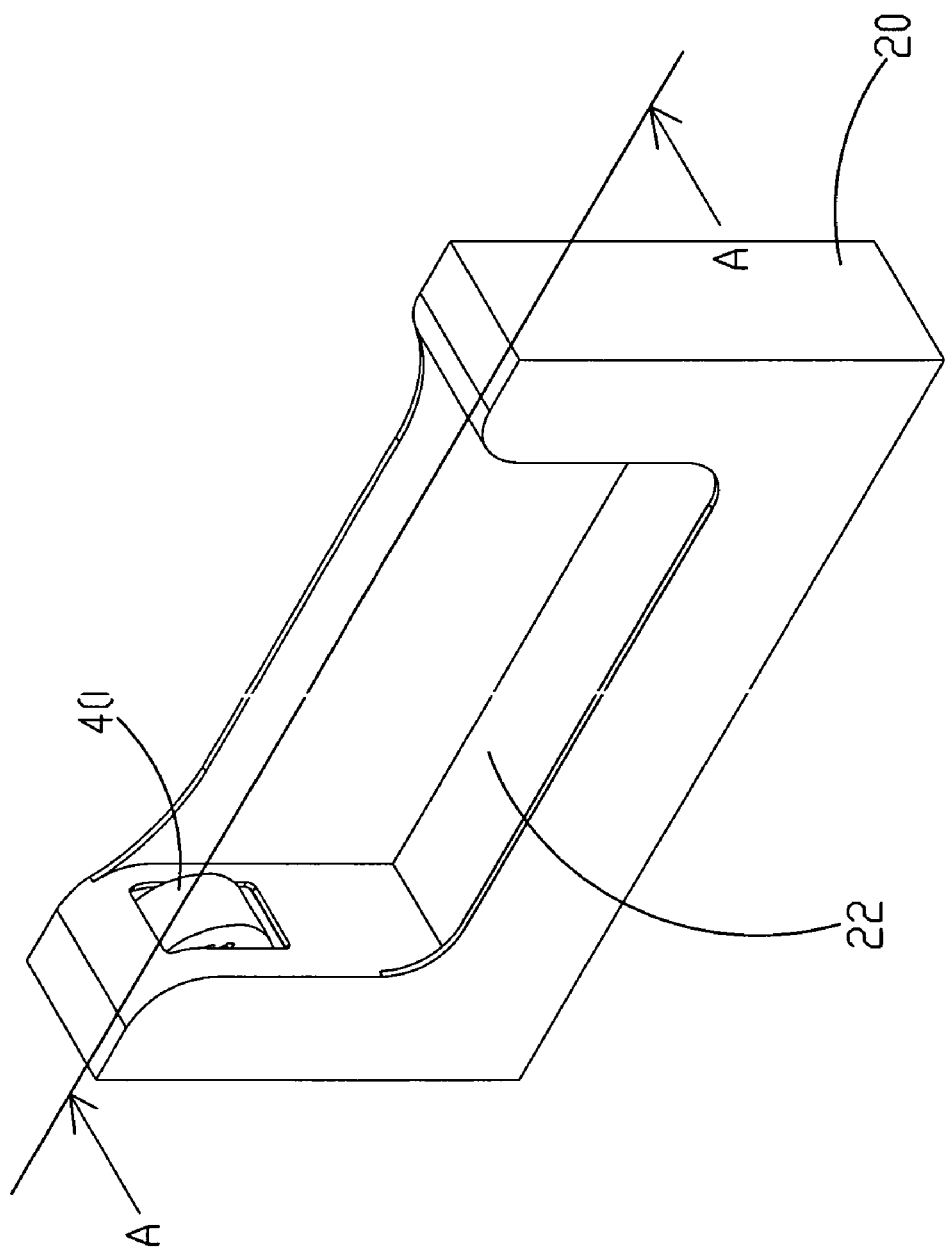
FIG. 1B is a perspective view showing a fixing structure of an embodiment according to the present invention.
Figure 1C:
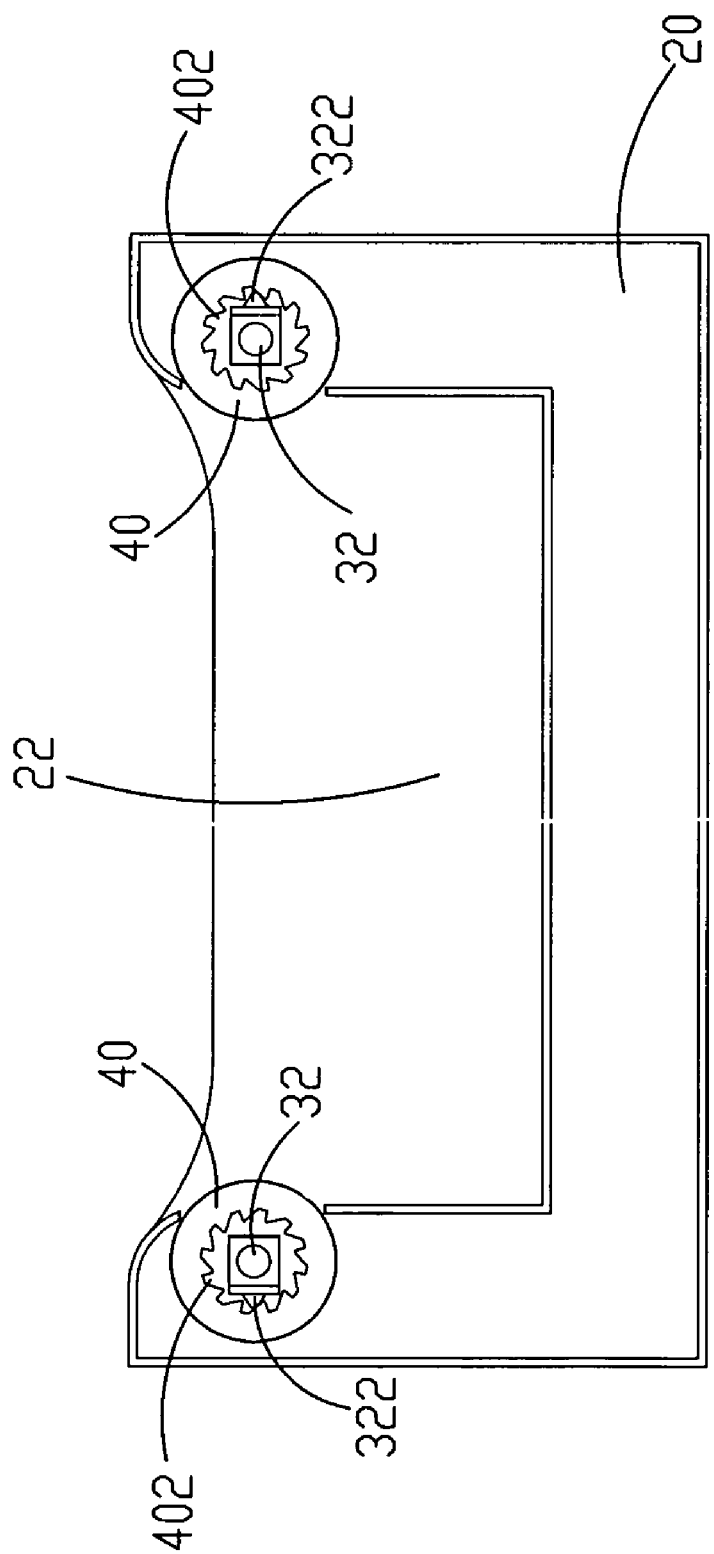
FIG. 1C is a cross sectional view along A-A line of the embodiment in the FIG. 1B.

Refer from FIG. 1A to FIG. 1C, a fixing member of handheld electronics 10 according to the present invention consists of a fixing seat 20, a rotation axis 32 and at least one one-way rolling member 40. The fixing seat 20 is mounted with a slot 22 and the rotation axis 32 is disposed on the fixing seat 20. A stopping member 322 is set on one side of the rotation axis 32 while the one-way rolling member 40 is pivoted in the fixing seat 20 by the rotation axis 32 and part of the one-way rolling member 40 exposes outside (out of) a slot 22. The stopping member 322 leans against a side wall of the one-way rolling member 40.

The one-way rolling member 40 includes a ratchet or a one-way bearing. In this embodiment, the ratchet is used. A plurality of serrated grooves 402 is set inside the one-way rolling member 40. When the one-way rolling member 40 is assembled on the rotation axis 32, the stopping member 322 leans against one of the serrated grooves 402. As shown in figure, the slopes of two sides of the serrated groove 402 are different. One side thereof has larger slope so that resistance between this side and the stopping member 322 is smaller. Thus the one-way rolling member 40 gets easier to roll in one direction, compared with the reverse direction. The rolling member 40 may even stop in the reverse direction. In this embodiment, the one-way rolling member 40 tends to roll toward the slot 22 while gets difficult in the reverse direction. Thus when a handheld electronic 10 is set in the slot 22, the side wall of the handheld electronic 10 leans against the one-way rolling member 40 so that the handheld electronic 10 is slipped into the slot 22 smoothly. Therefore, the handheld electronic 10 is easily set into the slot 22 and is difficult to fall off from the slot 22.

If the one-way rolling member 40 is a one-way bearing, the one-way bearing rolls around the rotation axis 32 in a single direction when the one-way bearing is disposed on the rotation axis 32. Thus there is no need to dispose the stopping member 322 on the rotation axis 32 for enabling the one-way rolling member 40 rolling in a single direction. Moreover, the side wall of the one-way rolling member 40 is made of elastic material or material having larger friction (resistance). The elastic material includes rubber. When the handheld electronic 10 is set in the slot 22, the side wall of the one-way rolling member 40 leans against the handheld electronic 10 and the handheld electronic 10 is clipped firmly by the elasticity of the side wall of the one-way rolling member 40.

Figure 2A:
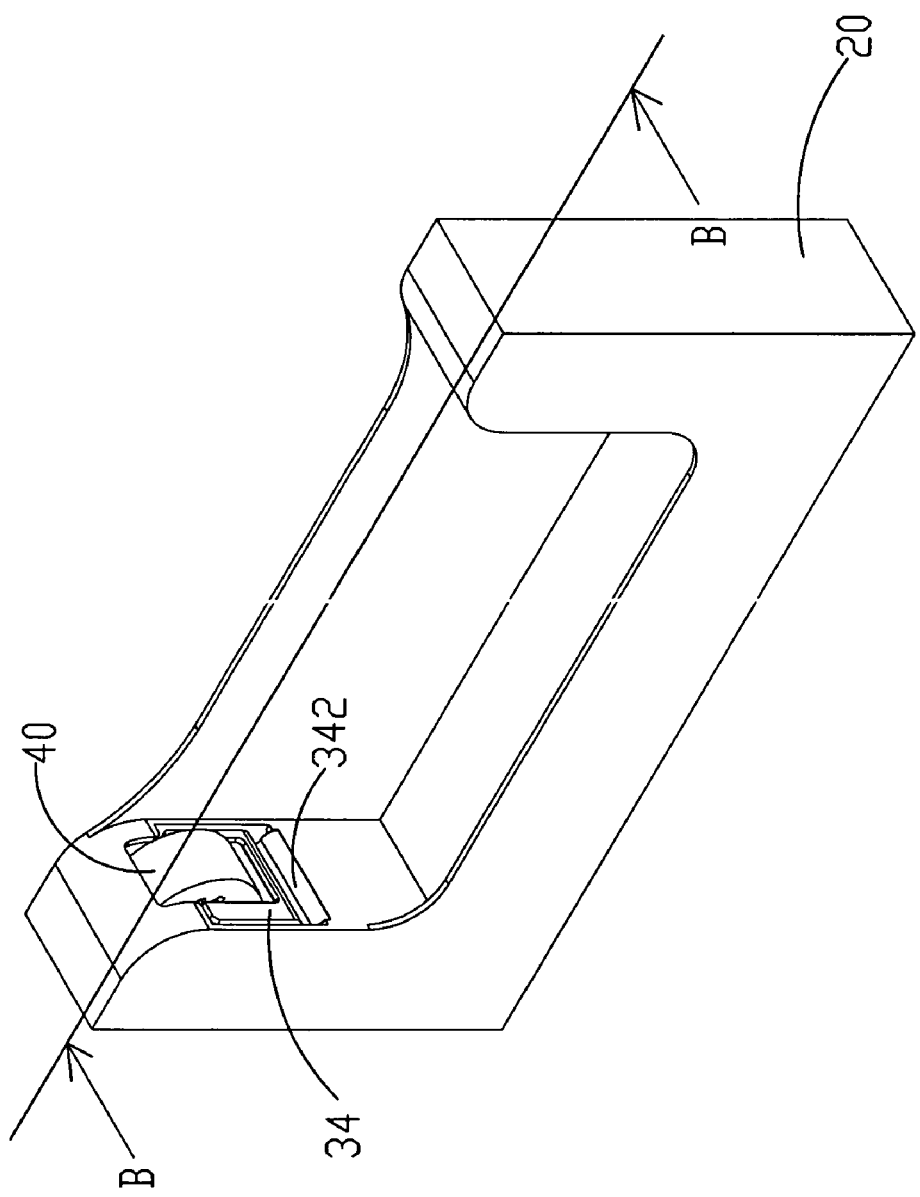
FIG. 2A is a perspective view of another embodiment according to the present invention.
Figure 2B:
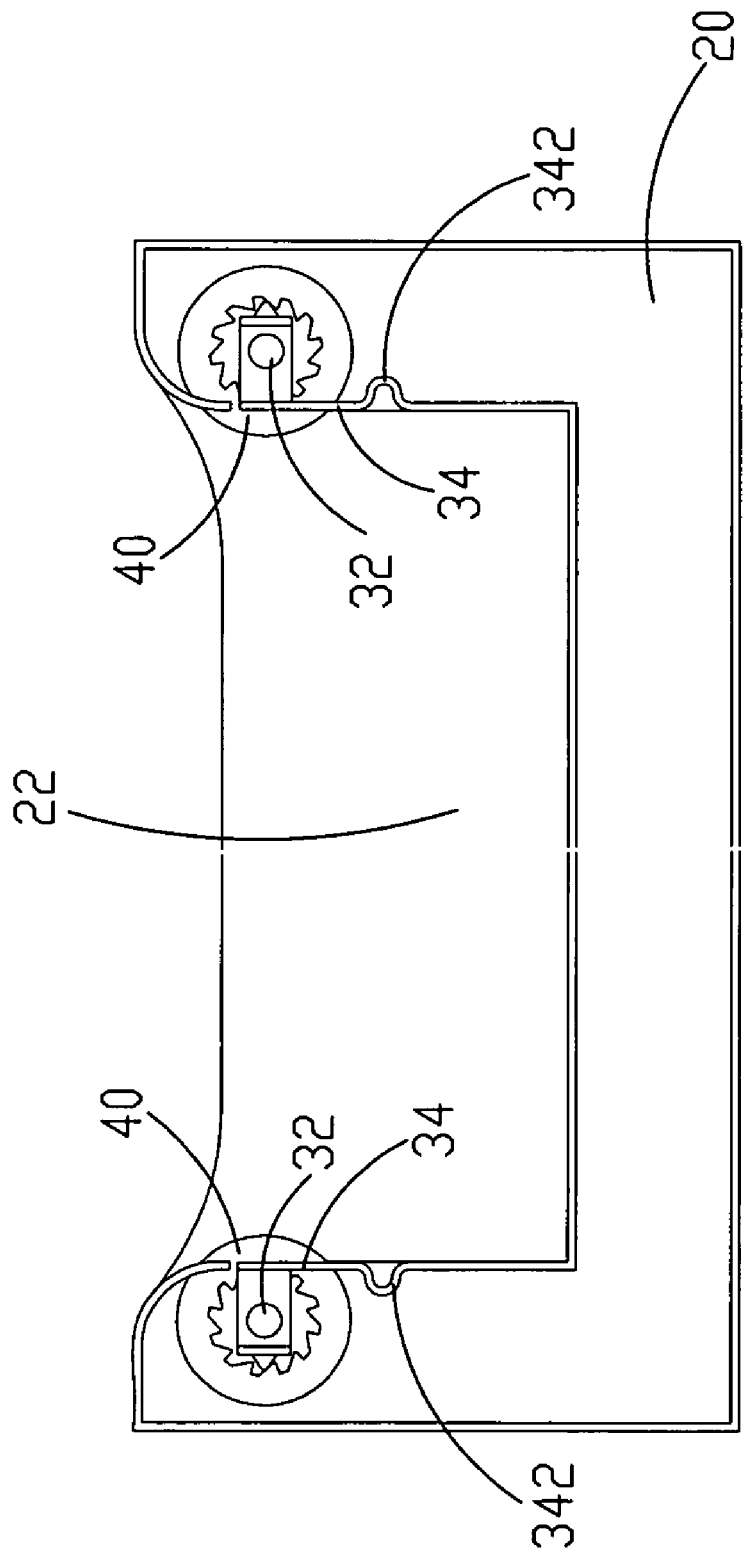
FIG. 2B is a cross sectional view along B-B line of the embodiment in the FIG. 2A.

Refer to FIG. 2A & FIG. 2B, another embodiment is disclosed. This embodiment further includes an elastic arm 34 that is disposed on a side wall of the slot 22 and a rotation axis 32 is set on the elastic arm 34. By the elastic arm 34, the one-way rolling member 40 has elasticity for clipping so that the handheld electronic 10 is mounted in the slot 22 more stably. Furthermore, the size of the handheld electronic 10 may vary and the preset distance for clipping between the one-way rolling member 40 and the handheld electronic 10 also changes. Thus by the elastic arm 34, the handheld electronic 10 is clipped more firmly by the one-way rolling member 40. Moreover, the elastic arm 34 is disposed with a bending part 342 so that the elastic arm 34 is more flexible.

Figure 3:
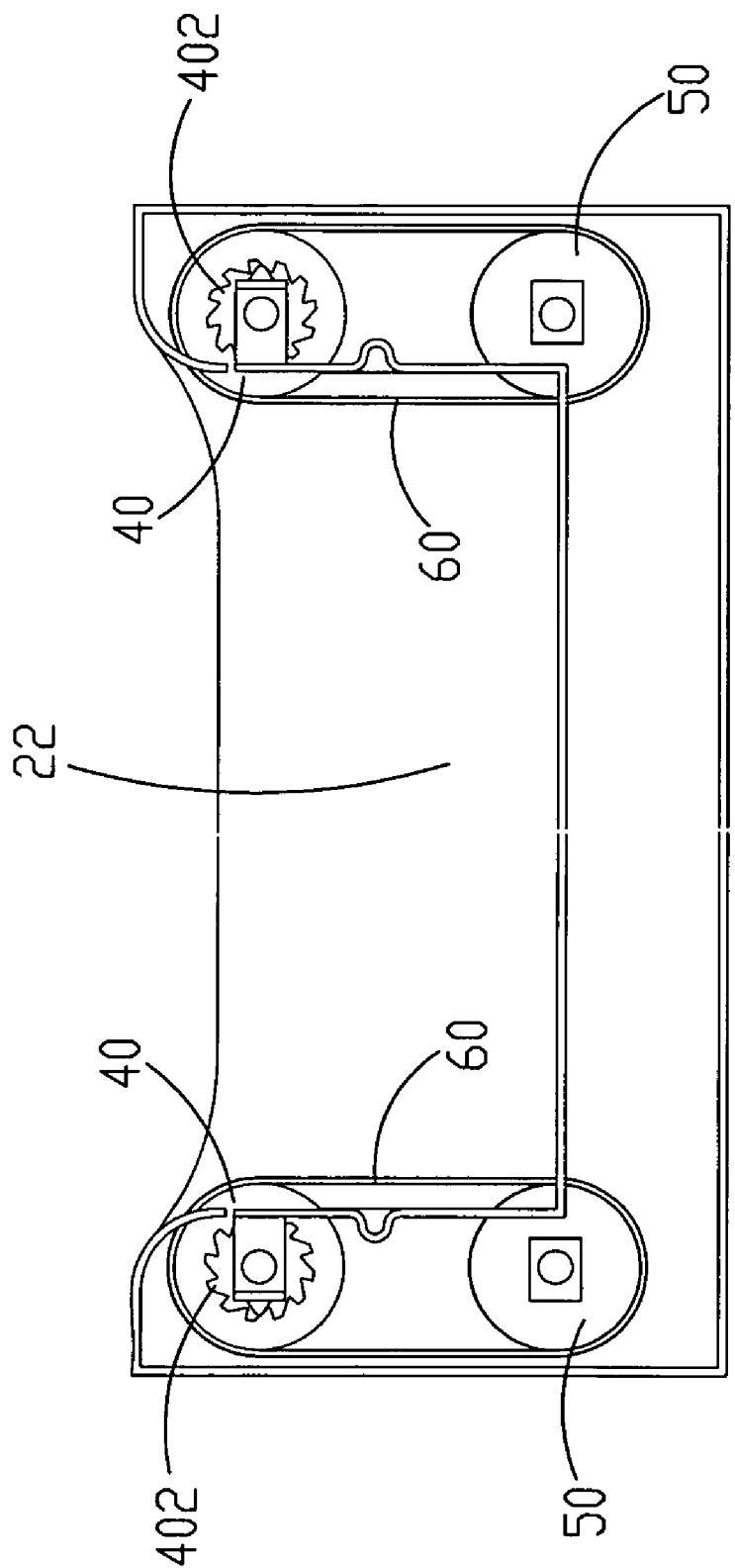
FIG. 3 is a cross sectional view of a further embodiment according to the present invention.

Refer to FIG. 3, a further embodiment is disclosed. The difference between this embodiment and above one is in that this embodiment further includes a rolling member 50 and a conveyor belt 60. The rolling member 50 is pivoted inside the fixing seat 20 and a part thereof exposes on inner surface of the slot 22. The rolling member 50 is on the same side of the one-way rolling member 40 and the conveyor belt 60 is putted around the one-way rolling member 40 and the rolling member 50. The rolling member 50 is an idler wheel and the conveyor belt 60 is made of rubber. When the handheld electronic 10 is set in the slot 22, the conveyor belt 60 leans against the side wall of the handheld electronic 10. The one-way rolling member 40 in combination with the rolling member 50 drives the conveyor belt 60 to move forward and backward and attach on side wall of the handheld electronic 10 so as to hold the handheld electronic 10 inside the slot 22. The contact area is increased by the conveyor belt 60 and the friction force is also increased. Therefore, the handheld electronic 10 is mounted more stably.

In summary, a fixing member for handheld electronics according to the present invention includes a fixing seat, a rotation axis and at least one one-way rolling member. The fixing seat is disposed with a slot and the rotation axis is set on the fixing seat. The one-way rolling member is pivoted in the fixing seat and part of the on-way rolling member exposes on the surface of the slot while the one-way rolling member is set on the rotation axis. Thus a side wall of the handheld electronic leans against the one-way rolling member when a handheld electronic is set inside the slot. Therefore, the handheld electronic is mounted inside the slot easily and stably without falling off.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A fixing member for a handheld electronic comprising:
   a fixing seat disposed with a slot;
   a rotation axis disposed in the fixing seat; and
   at least one one-way rolling member pivoted in the fixing seat and part of the one-way rolling member exposing on inner surface of the slot; the one-way rolling member is set on the rotation axis;
   a rolling member pivoted in the fixing seat, wherein part of the rolling member exposes on inner surface of the slot while the rolling member is on the same side of the one-way rolling member; and
   a conveyor belt disposed around the one-way rolling member and the rolling member.

2. The device as claimed in claim 1, wherein the conveyor belt is made of rubber.

3. The device as claimed in claim 1, wherein the rolling member is an idler wheel.

* * * * *